US005465934A

United States Patent [19]
Gonzalez

[11] Patent Number: 5,465,934
[45] Date of Patent: Nov. 14, 1995

[54] BRACKET FOR A CPU DAUGHTER CARD

[75] Inventor: Adolpho Gonzalez, San Jose, Calif.

[73] Assignee: Silicon Graphics, Inc., Mountain View, Calif.

[21] Appl. No.: 168,165

[22] Filed: Dec. 17, 1993

[51] Int. Cl.[6] .................................................. A47B 96/06
[52] U.S. Cl. ...................................... 248/223.41; 361/683
[58] Field of Search ................................ 248/214, 309.1, 248/225.1, 223.4, 224.2; 361/679, 683, 684

[56] References Cited

U.S. PATENT DOCUMENTS

| 3,822,049 | 7/1974 | Saunders | 248/223.4 X |
| 5,026,016 | 6/1991 | Lisowski | 248/225.1 X |
| 5,155,663 | 10/1992 | Harase | 361/684 |
| 5,161,169 | 11/1992 | Galano | 361/684 X |
| 5,190,153 | 3/1993 | Schultz | 248/225.1 X |
| 5,325,263 | 6/1994 | Singer | 361/683 |
| 5,339,213 | 8/1994 | O'Callaghan | 361/683 |

FOREIGN PATENT DOCUMENTS 6482  7/1989  WIPO .................................... 361/683

Primary Examiner—J. Franklin Foss
Attorney, Agent, or Firm—Sterne, Kessler, Goldstein & Fox

[57] ABSTRACT

A bracket for securing a daughter card within a computer housing. The computer housing having a housing base. The bracket having a bracket base. The bracket base having a base tab for slidably securing the bracket to the housing base. The bracket also has a securing means for engaging the daughter card and for securing the daughter card. The securing means has a first slot for accepting the daughter card and a second slot, perpendicularly aligned at a first end of the first slot, for accepting the daughter card and for directing the daughter card into the first slot.

17 Claims, 2 Drawing Sheets

BRACKET FOR A CPU DAUGHTER CARD

BACKGROUND OF THE INVENTION

1. Field of the Invention

The present invention relates generally to computers, and more particularly, to a self contained daughter card bracket for securing a daughter card within a computer housing.

2. Related Art

When designing a computer many factors must be considered. Some technical considerations are: processor speed, bus size, memory requirements, and the physical size of the computer housing. When positioning components within the computer housing it is desirable to position some components such that they are easily removable by a user or technician. An example of such a component is a CPU daughter card.

The purpose of a daughter card bracket is to securely fasten a daughter card to the computer housing. It is desirable to design the daughter card bracket such that the bracket and/or the daughter card can be easily removed from the computer housing.

Typically, the daughter card is secured to a daughter card bracket using an extrinsic securing device, e.g., a screw or a bolt. In addition, the daughter card bracket is typically secured to the computer housing using a similar extrinsic securing device.

Using such extrinsic securing devices has many disadvantages. When removing the daughter card or the daughter card bracket, screws are periodically misplaced. If all of the screws are not used to attach the daughter card to the daughter card bracket or the daughter card bracket to the housing, the daughter card can vibrate. Such vibration can damage components on the daughter card and/or components near the daughter card. This can adversely affect the operation of the computer system.

Another disadvantage of using extrinsic securing devices to connect the daughter card to the daughter card bracket and to connect the daughter card bracket to the computer housing is that additional time and effort is required to accomplish the task. When replacing the daughter card, the daughter card bracket, or both, the user or technician must physically unfasten each extrinsic securing device, e.g., each screw or bolt, in order to disengage the daughter card from the daughter card bracket or to disengage the daughter card bracket from the computer housing. This process is tedious and time consuming.

What is needed is a self-contained daughter card bracket which enables the user to quickly and efficiently secure the daughter card bracket to the computer housing and to quickly and efficiently disengage the daughter card bracket from the computer housing. In addition the self-contained daughter card bracket should allow the user to quickly and efficiently secure a daughter card to the daughter card bracket and to quickly and efficiently disengage the daughter card from the daughter card bracket without the use of extrinsic securing devices.

SUMMARY OF THE INVENTION

The present invention is daughter card bracket for removably mounting the daughter card within a computer housing. The daughter card bracket has a base. The base has a base tab for slidably securing the daughter card bracket to the housing base. The bracket also has securing means for removably securing the daughter card to the daughter card bracket.

The daughter card bracket of the present invention improves upon the traditional method of securing daughter card brackets within a computer housing. The daughter card bracket of the present invention does not require extrinsic securing devices to be secured to the computer housing. In addition, the daughter card bracket of the present invention secures a daughter card therein without using any extrinsic securing devices, e.g., screws or bolts. By obviating the need for extrinsic securing devices the present invention enables the user to save time and effort when removing or securing the bracket to the computer housing and when removing the daughter card from or securing the daughter card to the daughter card bracket.

BRIEF DESCRIPTION OF THE FIGURES

The foregoing and other objects, features and advantages of the invention will be apparent from the following more particular description of the preferred embodiments of the invention, as illustrated in the accompanying drawings, wherein.

DETAILED DESCRIPTION OF THE PREFERRED EMBODIMENT

The preferred embodiment of the invention is now described with reference to the figures where like reference numbers indicate identical or functionally similar elements. Also in the figures, the left most digit of each reference number corresponds to the figure in which the reference number is first used. While specific steps, configurations and arrangements are discussed, it should be understood that this is done for illustrative purposes only. A person skilled in the relevant art will recognize that other steps, configurations and arrangements can be used without departing from the spirit and scope of the invention.

Figure 1:
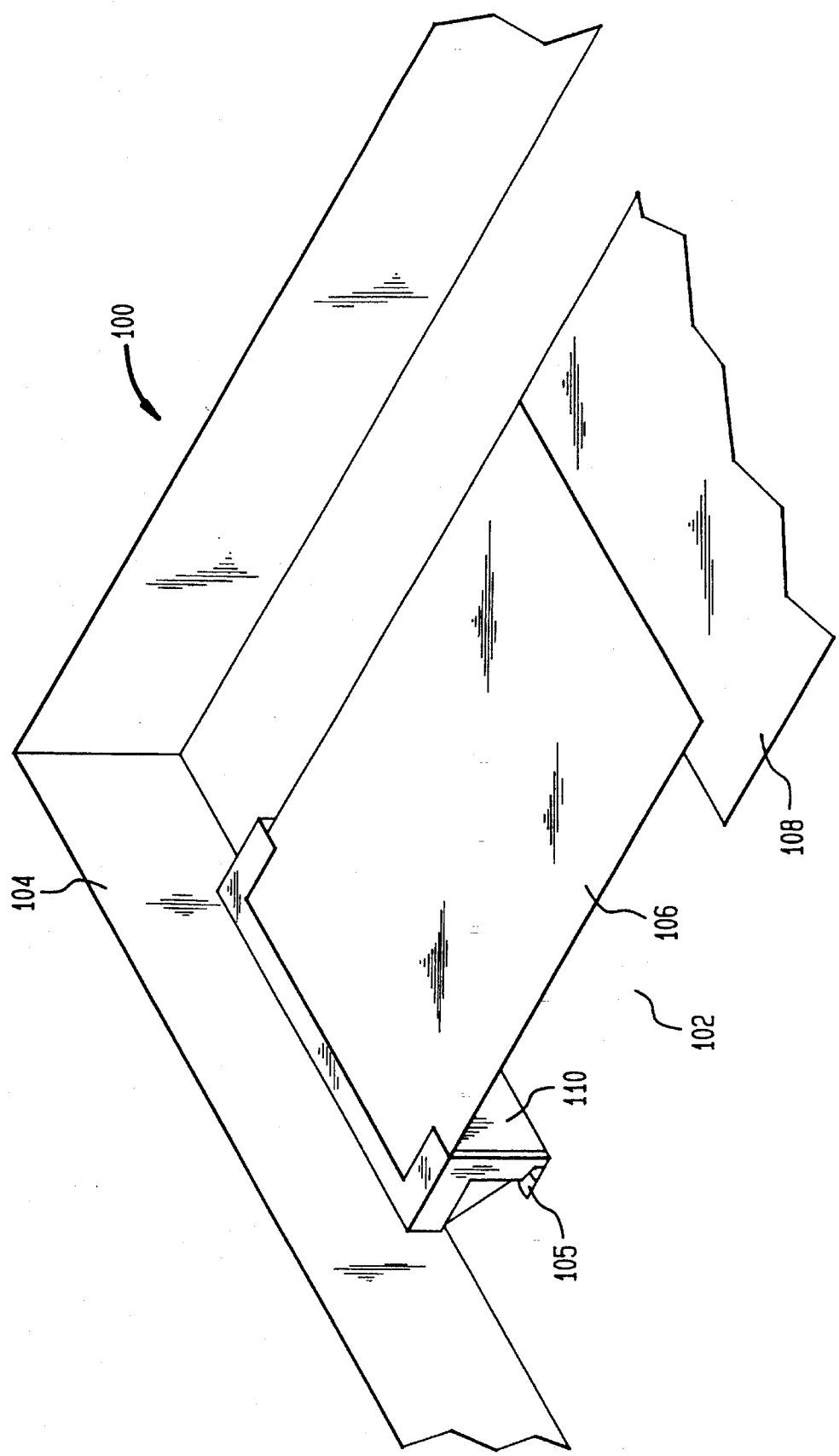
FIG. 1 is an illustration showing a perspective view of the daughter card of the present invention secured within a computer housing.

FIG. 1 shows a computer system 100 having a computer housing 101, a main printed circuit board (PCB) 108, a daughter card 106 and a daughter card bracket 110.

The computer housing 101 has a housing base 102, housing walls 104 and a housing cover (not shown). The housing base 102 has two housing base handles 105 (only one handle shown) protruding inward, i.e., toward the housing cover. The housing base handles 105 form an opening into which the daughter card bracket 110 can be inserted.

In the preferred embodiment the main PCB 108 contains one or more microprocessors chips, a main memory comprising RAM, and input/output (I/O) system, and the like, as would be apparent to a person skilled in the art. The details of the computer system and components of the microprocessor are beyond the scope of the present invention, and thus, will not be further described.

The daughter card 106 contains a processor and/or additional memory. In the preferred embodiment, the daughter card 106 is also a PCB that is attached to the main PCB 108 via mating electrical connectors (not shown) located on the PCB 108 and on the daughter card 106. When the daughter card 106 is positioned on the PCB 108 the mating connectors couple, thereby electrically coupling and mechanically securing the daughter card 106 to the PCB 108.

The daughter card 106 must also be secured to the computer housing. A significant feature of the present invention is how the daughter card bracket 110 secures the daughter card 106 to the computer housing.

Figure 2:
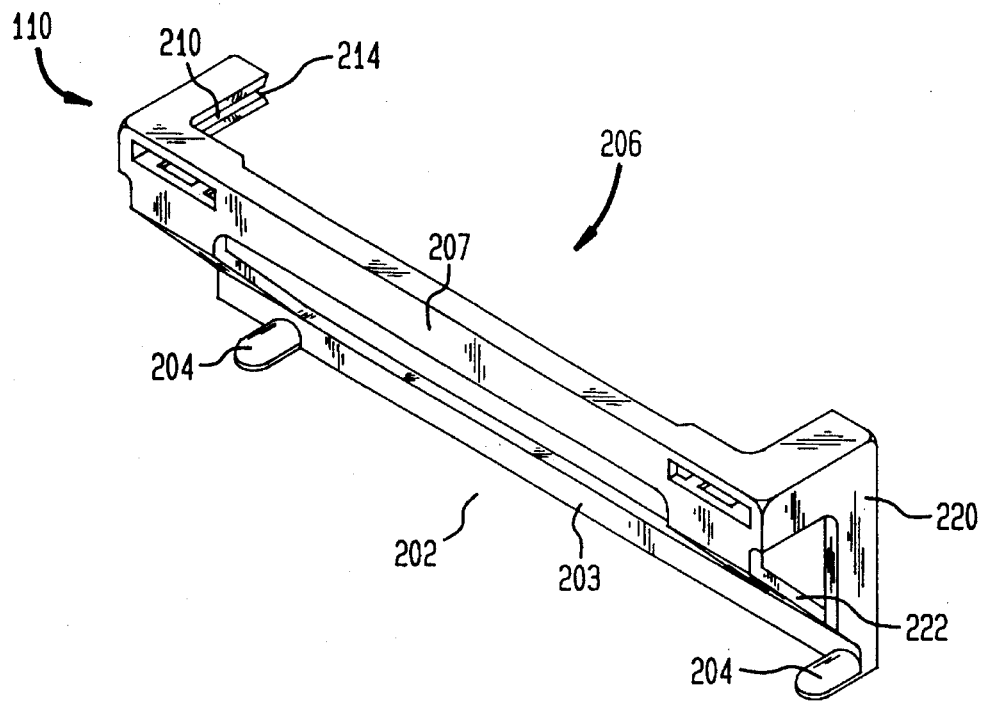
FIG. 2 is an illustration showing a front perspective view of the daughter card bracket of the present invention.
Figure 3:
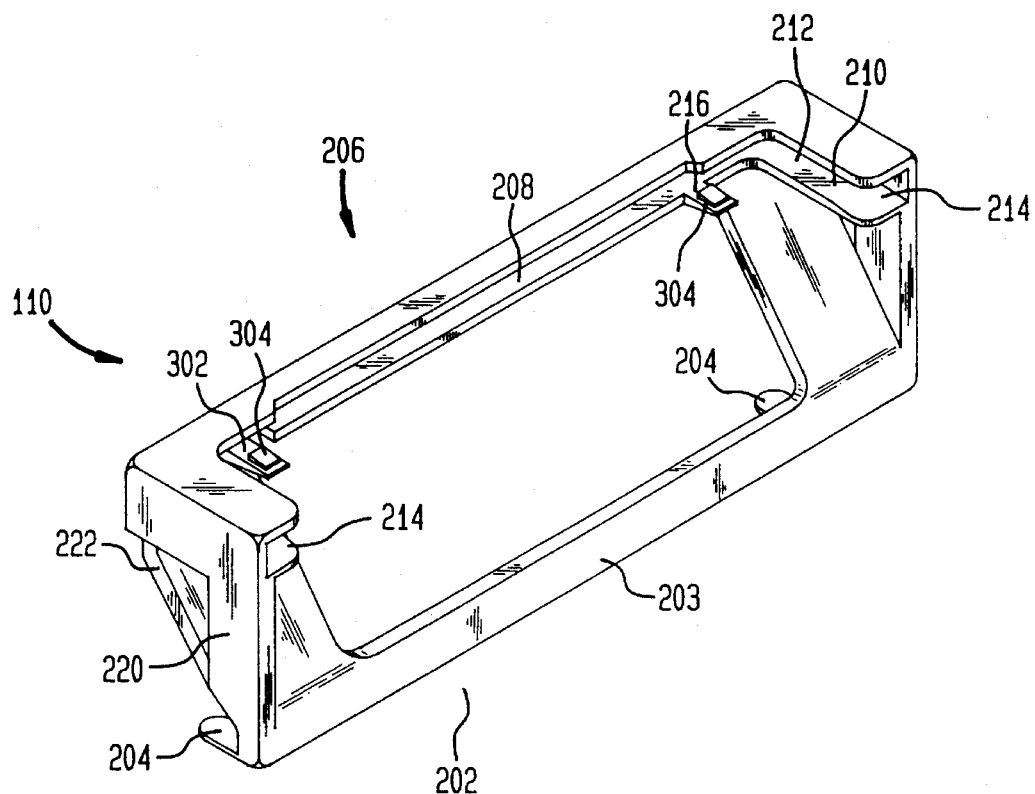
FIG. 3 is an illustration showing a back perspective view of the daughter card bracket of the present invention.

FIG. 2 and FIG. 3 illustrate two perspectives of the daughter card bracket 110. The daughter card bracket 110 has a bracket base 202. The bracket base 202 is positioned against the housing base 102 when located within the computer housing 101.

The bracket base 202 includes two base tabs 204 which extend outward in the direction perpendicular to the bracket base 202 and parallel to the housing base 102. As shown in FIG. 2, the base tabs 204 are designed to slidably secure the daughter card bracket 110 to the housing base 102. The term "slidably secure" means that in order to secure the daughter card bracket 110 to the housing base 102 the daughter card bracket 110 slides into a secured position. The secured position is achieved by sliding the base tabs 204 into openings created by the housing base handles 105.

When the daughter card bracket 110 is in the secure position, the daughter card bracket 110 cannot be lifted upwards or moved sideways. That is, when secured, the daughter card bracket 110 cannot move: (1) in the direction which is both perpendicular to the housing base 102 and perpendicular to the base tabs 204; or (2) in the direction which is both parallel to the housing base 102 and perpendicular to the base tabs 204. When the daughter card bracket 110 is in the secure position a card securing portion 206 has a wall 207 which is adjacent to, and applies pressure on, the housing wall 104.

In the preferred embodiment, the daughter card bracket 101 is made of injection molded plastic. The plastic should be strong enough to prevent the base tabs 204 from detaching from the bracket base 202. In the preferred embodiment, the bracket is formed using an open and shut injection molding technique with no lifters, i.e., using a two piece mold. In the preferred embodiment, the plastic used to form the daughter card bracket 110 is the General Electric material number 141 LEXAN, 701 Black. This plastic is slightly elastic. Such elasticity permits the two securing tabs 302 (discussed below) to secure the daughter card 106 to the daughter card bracket 110. It will be apparent to persons skilled in the art that alternate material may be used to form the daughter card bracket 110.

The daughter card bracket 110 also comprises the card securing portion 206. In the preferred embodiment, the card securing portion 206 securely couples the daughter card 106 to the daughter card bracket 110. The card securing portion 206 has a card accepting slot 208. The length of the card accepting slot is sufficient to accept the daughter card edge which is to be inserted into the daughter card bracket 110. The height of the slot is sufficient to accept the height of the daughter card 106 which is to be inserted into the daughter card bracket 110. The card securing portion 206 also has two card directing slots 210. Each card directing slot 210 is perpendicularly coupled to an end of the card accepting slot 208.

The card directing slot 210 has a receiving end 214 and a directing end 212. The receiving end receives the daughter card 106. The height of the card directing slot 210 progressively narrows from the receiving end 214 to the directing end 212. The width of the directing end 212 of the card directing slot 108 is approximately equal to the width of the card accepting slot 208. This progressive narrowing of the card directing slot 210 enables the daughter card 106 to be easily accepted into the receiving end 214 of each card directing slot 210. As the daughter card 106 continues sliding through the card directing slot 210, the daughter card 106 is precisely directed into the card accepting slot 208.

In the preferred embodiment, two securing tabs 302 are located adjacent to the lower boundary of the card accepting slot 208. The securing tabs 302 are small extensions from the bottom of the card accepting slot 208. The daughter card 106 will slide over the securing tabs 302 when inserted into the card accepting slot 208. A securing tab knob 304 on the outer end of each securing tab 302 faces the daughter card 106 when the daughter card 106 is in the card accepting slot 208. The securing tab knob 304 is a protuberance, i.e., a raised portion, on the securing tab 302. Each securing tab knob 304 snaps into a indentation on the daughter card 106 when the daughter card 106 is securely positioned in the daughter card bracket 110. The securing tab 302 helps secure the daughter card 106 into the daughter card bracket 110.

Alternate embodiments of the card securing portion include having a different number of securing tab(s) and having the securing tab(s) located adjacent to the upper boundary of the card accepting slot 208. Other securing techniques will become apparent to persons skilled in the art without departing from the scope of the present invention.

In the preferred embodiment, the bracket base 202 and the card securing portion 206 are connected to each other via two supports 220 and 222. A first support 220 connects the bracket base 202 with the receiving end of the card directing slots 210. A second support 222 connects the bracket base 202 with the card accepting slot 210. As with the other elements of the daughter card bracket 110, these supports are made of plastic. Any support structure which provides the necessary strength and stability can be substituted for these two supports 220, 222.

Securing the daughter card bracket 110 to the computer housing 101 does not require the use of extrinsic securing devices, e.g., screws or bolts. As a result, the daughter card bracket 110 of the present invention enables a technician to quickly and efficiently disengage and secure the daughter card from the computer housing.

While the invention has been particularly shown and described with reference to a preferred embodiment thereof, it will be understood by those skilled in the art that various change in form and details may be made therein without departing from the spirit and scope of the invention.

What is claimed is:

1. A bracket for securing a daughter card within a computer housing having a housing base, the bracket comprising:

a base having a base tab for slidably securing the bracket to the housing base; and a securing means, coupled to said base, for engaging the daughter card and for securing the daughter card, said securing means having a slot for accepting an edge of the daughter card and a tab adjacent to said slot, said tab having a raised portion for securing the daughter card in said slot.

2. The bracket of claim 1, wherein said securing means has a second slot perpendicularly aligned at a first end of the first slot in said securing means for accepting the edge of the daughter card and for directing the edge of the daughter card into said first slot.

3. The bracket of claim 2, wherein said second slot has a height which decreases from a receiving end to a directing end of said second slot.

4. The bracket of claim 1, wherein said bracket has a first support means, coupled between said securing means and said base, for supporting the securing means.

5. The bracket of claim 4, wherein said bracket has a second support means, coupled between said second slot and said base, for supporting said securing means.

6. A computer system comprising:

a housing having a housing base:

a main printed circuit board (PCB) mounted in said housing, and positioned substantially parallel to said housing base;

a daughter card;

a daughter card bracket for removably mounting said daughter card within said housing and adjacent to said main PCB, said daughter card bracket comprising:
a base having a base tab for slidably securing the daughter card bracket to said housing base; and
a securing means, coupled to said base, for removably securing said daughter card to said daughter card bracket and thus to said housing base.

7. The computer system of 6, wherein said securing means has a first slot for accepting an edge the daughter card.

8. The computer system of claim 7, wherein said securing means has a second slot perpendicularly positioned at a first end of said first slot for accepting the edge of the daughter card and for directing the edge of the daughter card into said first slot.

9. The computer system of claim 8, wherein said second slot has a height which decreases from a receiving end to a directing end of said second slot.

10. The computer system of claim 7, wherein said securing means has a tab adjacent to said first slot, said tab having a raised portion for securing the daughter card in said first slot.

11. The computer system of claim 6, wherein said daughter card bracket has a first support means, coupled between said securing means and said base, for supporting the securing means and said daughter card.

12. The computer system of claim 11, wherein said daughter card bracket has a second support means, coupled between said second slot and said base, for supporting said securing means and said daughter card.

13. A bracket for securing a daughter card within a computer housing having a housing base, the bracket comprising:

a base having a base tab for slidably securing the bracket to the housing base; and a securing means, coupled to said base, for engaging the daughter card and for securing the daughter card, wherein said securing means has a slot for accepting an edge of the daughter card; and a support means, coupled between said securing means and said base, for supporting the securing means.

14. The bracket of claim 13, wherein said securing means has a second slot perpendicularly aligned at a first end of the first slot in said securing means for accepting the edge of the daughter card and for directing the edge of the daughter card into said first slot.

15. The bracket of claim 14, wherein said second slot has a height which decreases from a receiving end to a directing end of said second slot.

16. The bracket of claim 13, wherein said securing means has a tab adjacent to said first slot, said tab having a raised portion for securing the daughter card in said first slot.

17. The bracket of claim 13, wherein said bracket has a second support means, coupled between said second slot and said base, for supporting said securing means.

* * * * *